(12) United States Patent
Huang et al.

(10) Patent No.: US 11,296,250 B2
(45) Date of Patent: Apr. 5, 2022

(54) SEMICONDUCTOR HETEROJUNCTION, FIELD EFFECT TRANSISTOR AND PHOTODETECTOR INCLUDING THE SAME

(71) Applicant: National Tsing Hua University, Hsinchu (TW)

(72) Inventors: Michael Hsuan-Yi Huang, Hsinchu (TW); An-Ting Lee, Miaoli County (TW); Chih-Shan Tan, Hsinchu (TW); Pei-Lun Hsieh, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 38 days.

(21) Appl. No.: 16/854,252

(22) Filed: Apr. 21, 2020

(65) Prior Publication Data
US 2021/0217920 A1  Jul. 15, 2021

(30) Foreign Application Priority Data

Jan. 10, 2020 (TW) .................. 109100987

(51) Int. Cl.
| H01L 31/102 | (2006.01) |
| H01L 31/112 | (2006.01) |
| H01L 31/0336 | (2006.01) |

(52) U.S. Cl.
CPC ...... *H01L 31/1129* (2013.01); *H01L 31/0336* (2013.01)

(58) Field of Classification Search
CPC ............. H01L 31/1129; H01L 31/0336; H01L 2924/13051; H01L 29/737–739; H01L 29/66242; H01L 29/66318

USPC ......................................... 257/184
See application file for complete search history.

(56) References Cited

U.S. PATENT DOCUMENTS

| 2013/0105779 A1* | 5/2013 | Forrest .............. H01L 51/003 257/40 |
| 2013/0112233 A1* | 5/2013 | Coakley ............ H01L 31/0516 136/244 |
| 2014/0203329 A1* | 7/2014 | Saitoh ............... H01L 29/7788 257/194 |
| 2018/0358226 A1* | 12/2018 | Lee .................. H01L 29/0673 |

OTHER PUBLICATIONS

Hsieh et al., "Germanium Wafers Possessing Facet-Dependent Electrical Conductivity Properties", Angewandte Chemie International Edition, 2018, pp. 16162-16165, vol. 57, No. 49.
Tan et al., "Facet-Dependent Electrical Conductivity Properties of Cu2O Crystals", Nano Letters, 2015, pp. 2155-2160, vol. 15, No. 3.
(Continued)

*Primary Examiner* — Calvin Y Choi
(74) *Attorney, Agent, or Firm* — The Webb Law Firm

(57) ABSTRACT

The present disclosure provides a semiconductor heterojunction. The semiconductor heterojunction includes a bottom semiconductor, a top semiconductor and an electrode substrate. An upper surface of the bottom semiconductor includes a first facet. A lower surface of the top semiconductor includes a second facet, and the lower surface of the top semiconductor is contacted with the upper surface of the bottom semiconductor. The electrode substrate is disposed below the bottom semiconductor.

8 Claims, 18 Drawing Sheets

(56) References Cited

OTHER PUBLICATIONS

Tan et al., "Facet-Dependent Electrical Conductivity Properties of PbS Nanocrystals", Chemistry of Materials, 2016, pp. 1574-1580, vol. 28, No. 5.

Tan et al., "Facet-Dependent Electrical Conductivity Properties of Silver Oxide Crystals", Chemistry: An Asian Journal, 2017, vol. 12, No. 3, pp. 293-297.

Tan et al., "Silicon Wafers with Facet-Dependent Electrical Conductivity Properties", Angewandte Chemie International Edition, 2017, pp. 15339-15343, vol. 56, No. 48.

* cited by examiner

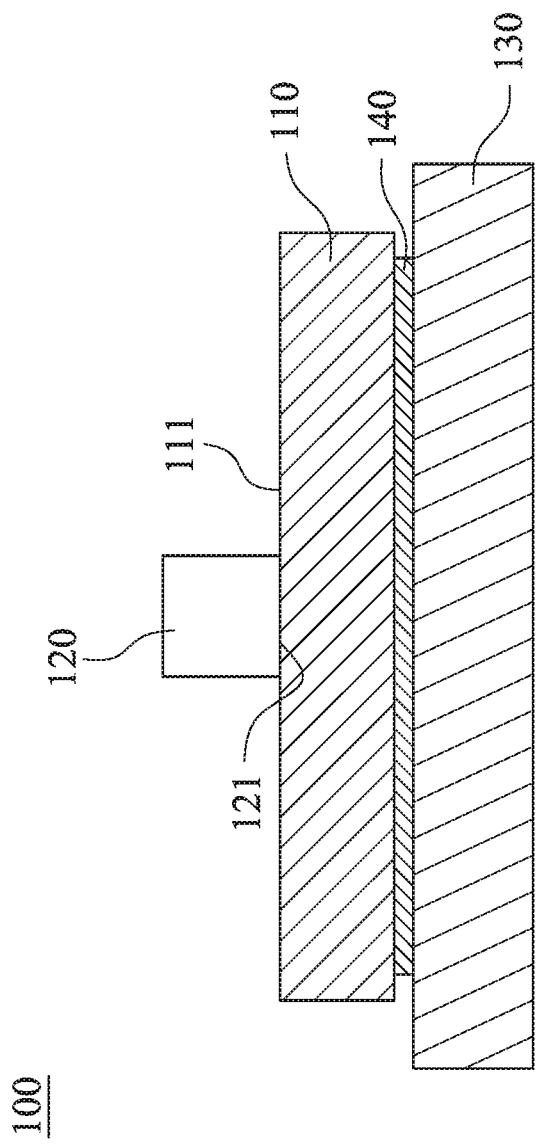

SEMICONDUCTOR HETEROJUNCTION, FIELD EFFECT TRANSISTOR AND PHOTODETECTOR INCLUDING THE SAME

CROSS-REFERENCE TO RELATED APPLICATIONS

This application claims priority to Taiwanese Patent Application No. 109100987 filed Jan. 10, 2020, the disclosure of which is hereby incorporated by reference in its entirety.

BACKGROUND OF THE INVENTION

Technical Field

The present disclosure relates to a semiconductor heterojunction. More particularly, the present disclosure relates to a facet-controlled semiconductor heterojunction and the field effect transistor and the photodetector including the same.

Description of Related Art

In recent years, the high-tech industry has flourished. Furthermore, in the chip constructed of an electronic circuit or an integrated circuit, the transistor made of the semiconductor is mainly used to modulate or switch the electronic signal to achieve the expected function.

At present, the development of the transistors is mainly focused on the miniaturization of components, and nanomaterials have attracted the attention of many researchers due to their optical, electrical and magnetic properties. The unique properties of the nanomaterials are related to size and shape. However, there are references proving that various faceted semiconductors, including crystals such as $Ag_2O$, $TiO_2$ or PbS, have conductive, photocatalytic, or optical properties related to the facet effect.

Therefore, exploring the performance of various faceted semiconductors, so that they can be applied to the electronics industry is the goal.

SUMMARY OF THE INVENTION

According to one aspect of the present disclosure, a semiconductor heterojunction is provided. The semiconductor heterojunction includes a bottom semiconductor, a top semiconductor and an electrode substrate. An upper surface of the bottom semiconductor includes a first facet. A lower surface of the top semiconductor includes a second facet, and the lower surface of the top semiconductor is contacted with the upper surface of the bottom semiconductor. The electrode substrate is disposed below the bottom semiconductor.

According to another aspect of the present disclosure, a field effect transistor is provided. The field effect transistor includes the semiconductor heterojunction according to the aforementioned aspect.

According to further another aspect of the present disclosure, a photodetector is provided. The photodetector includes the semiconductor heterojunction according to the aforementioned aspect.

BRIEF DESCRIPTION OF THE DRAWINGS

The present disclosure can be more fully understood by reading the following detailed description of the embodiment, with reference made to the accompanying drawings as follows:

FIG. 1 is a schematic diagram of a semiconductor heterojunction according to one embodiment of the present disclosure.

DETAILED DESCRIPTION OF THE INVENTION

Figure 2A:
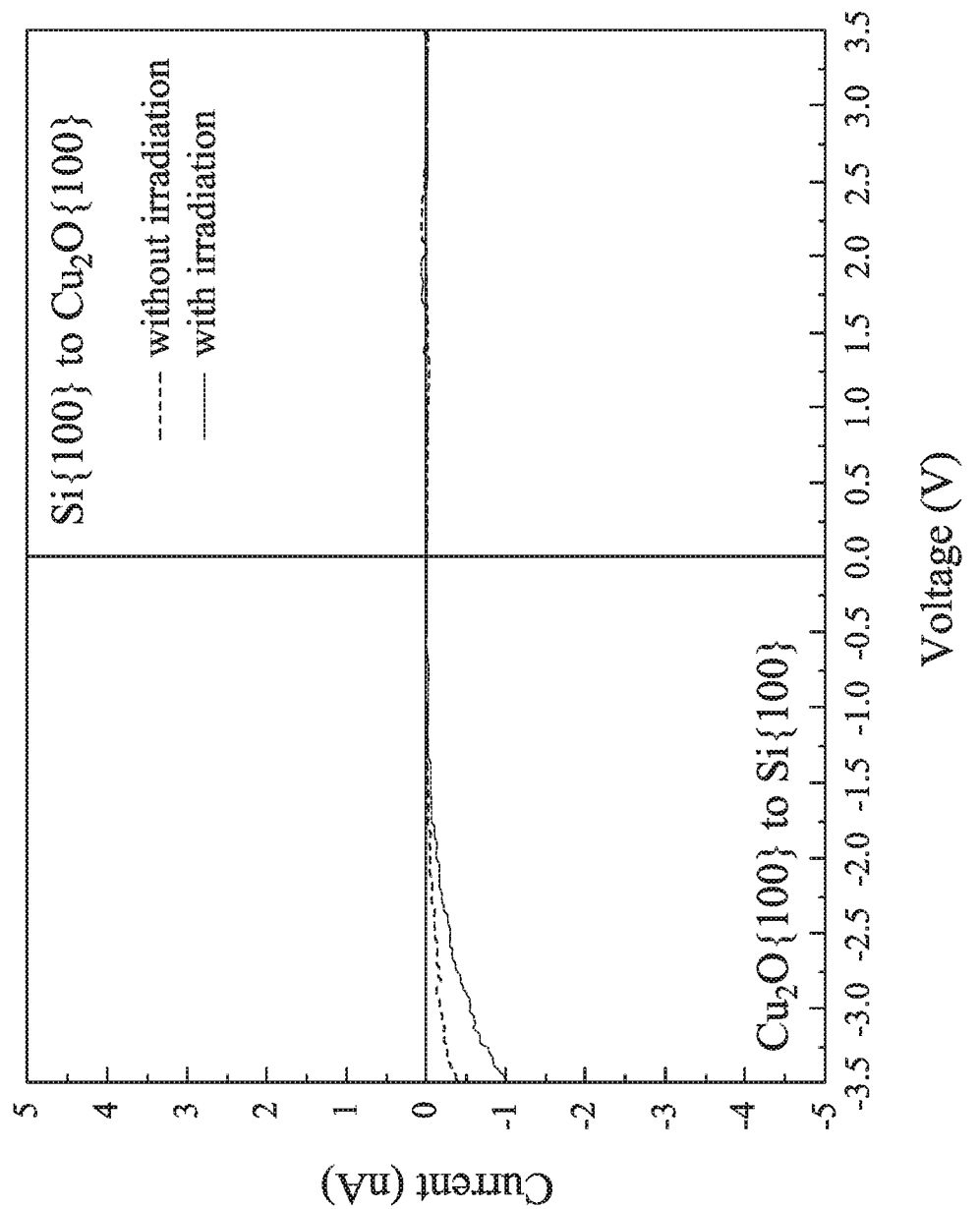
FIG. 2A is a graph of voltage-vs.-current with and without light illumination according to Example 1 of the present disclosure.

The embodiments of the present disclosure will be described below by referring to the figures. For clarity, many practical details will be explained in the following description. However, the readers should realize that these practical details are not limited to the present disclosure. That is, in some embodiments of the present disclosure, the practical details are not necessary. In addition, in order to simplify the figures, some of the conventional structures and elements will be shown in the figures with simplified schematic; and the repeated elements will be shown by the same reference numerals.

Semiconductor Heterojunction

Please refer to FIG. 1, which is a schematic diagram of a semiconductor heterojunction 100 according to one embodiment of the present disclosure. As shown in FIG. 1, the semiconductor heterojunction 100 includes a bottom semiconductor 110, a top semiconductor 120 and an electrode substrate 130.

Specifically, an upper surface of the bottom semiconductor 110 includes a first facet 111. A lower surface of the top semiconductor 120 includes a second facet 121, and the lower surface of the top semiconductor 120 is contacted with the upper surface of the bottom semiconductor 110. The electrode substrate 130 is disposed below the bottom semiconductor 110. Therefore, by making electrical contact to the different combination of the first facet 111 and the second facet 121, the phenomenon caused by the facet effect of the semiconductor can be observed, and can be further applied to related electronic or optical devices.

The bottom semiconductor 110 is a common semiconductor in the art. The bottom semiconductor 110 can be but not limited to a silicon wafer, a germanium wafer or a gallium arsenide wafer. Furthermore, in the present disclosure, the first facet 111 of the bottom semiconductor 110 can be a {100} facet, a {110} facet and a {111} facet, but not limited to the present disclosure.

The top semiconductor 120 is synthesized in a solution phase method, and coated on the bottom semiconductor 110. The coating method can be but not limited to spin coating or sputtering, so that the crystal of the solution phase is grown on the bottom semiconductor 110. The top semiconductor 120 can be but not limited to an oxide, a sulfide or a selenide. Furthermore, in the present disclosure, the second facet 121 of the top semiconductor 120 can be a {100} facet, a {110} facet and a {111} facet, but not limited to the present disclosure. More specifically, the top semiconductor 120 of the present disclosure is a cuprous oxide ($Cu_2O$) nanocrystal, which has a structure including a cube, an octahedron, and a rhombic dodecahedron. A $Cu_2O$ cube has the {100} facet, a $Cu_2O$ octahedron has the {111} facet, and a $Cu_2O$ rhombic dodecahedron has the {110} facet. Therefore, the different second facet 121 of the top semiconductor 120 can be synthesized by the solution phase method.

The electrical conductivity, the photocatalytic activity, or the related characteristics of the semiconductor heterojunction 100 of the present disclosure is observed by controlling the combination of the first facet 111 and the second facet 121. Therefore, the first facet 111 and the second facet 121 are selected from the group of the {100} facet, the {110} facet and the {111} facet. Furthermore, the semiconductor heterojunction 100 can further include a silver glue layer 140. The silver glue layer 140 is disposed between a lower surface of the bottom semiconductor 110 and the electrode substrate 130. The electrode substrate 130 can be but not limited to a stainless steel electrode. The silver glue layer 140 is the electrical contact, and the silver glue layer 140 is disposed between the lower surface of the bottom semiconductor 110 and the electrode substrate 130 can avoid the side facet contact.

The present disclosure will be further exemplified by the following specific embodiments so as to facilitate utilizing and practicing the present disclosure completely by the people skilled in the art without over-interpreting and over-experimenting. However, the readers should understand that the present disclosure should not be limited to these practical details thereof, that is, these practical details are used to describe how to implement the materials and methods of the present disclosure and are not necessary.

SYNTHESIS EXAMPLE

Synthesis Example 1 of the present disclosure is the $Cu_2O$ cube. For the $Cu_2O$ cube synthesis, 0.348 g of sodium dodecyl sulfate (SDS) and 38.20 mL of deionized water are added into a sample vial. Next, the sample vial is placed into a water bath at 31° C., and added 0.4 mL of 0.1 M $CuCl_2$ solution with gentle stirring for 10 minutes. Then, 0.8 mL of 1 M NaOH solution and 0.6 mL of 0.2 M $NH_2OH.HCl$ solution are added and reacted for 2 hours. Finally, the $Cu_2O$ cube particles are collected by centrifugation at 7500 rpm for 5 minutes and washed with 30 mL of 99.8% ethanol for 4 times. The facet of the $Cu_2O$ cube of Synthesis Example 1 is the {100} facet.

Synthesis Example 2 of the present disclosure is the $Cu_2O$ octahedron. For the $Cu_2O$ octahedron synthesis, 0.348 g of sodium dodecyl sulfate (SDS) and 36.20 mL of deionized water are added into the sample vial and kept at the room temperature. Next, the sample vial is added 0.4 mL of 0.1 M $CuCl_2$ solution with gentle stirring for 10 minutes. Then, 0.8 mL of 1 M NaOH solution and 2.6 mL of 0.2 M $NH_2OH.HCl$ solution are added and reacted for 2 hours. Finally, the $Cu_2O$ octahedral particles are collected by centrifugation at 7500 rpm for 5 minutes and washed with 30 mL of 99.8% ethanol for 4 times. The facet of the $Cu_2O$ octahedron of Synthesis Example 2 is the {111} facet.

Synthesis Example 3 of the present disclosure is the $Cu_2O$ rhombic dodecahedron. For the $Cu_2O$ rhombic dodecahedron synthesis, 0.348 g of sodium dodecyl sulfate (SDS) and 27.68 mL of deionized water are added into the sample via. Next, the sample vial is placed into a water bath at 31° C., and added 2.0 mL of 0.1 M $CuCl_2$ solution with gentle stirring for 10 minutes. Then, 0.72 mL of 1 M NaOH solution and 9.6 mL of 0.1 M $NH_2OH.HCl$ solution are added and reacted for 1 hour. Finally, the $Cu_2O$ rhombic dodecahedral particles are collected by centrifugation at 7500 rpm for 5 minutes and washed with 30 mL of 99.8% ethanol for 4 times. The facet of the $Cu_2O$ rhombic dodecahedron of Synthesis Example 3 is the {110} facet.

EXAMPLE

For Example 1 to Example 9 of the present disclosure, the silicon wafer and the germanium wafer with different facets are cut to fragment with area of 0.8 $cm^2$, and then washed with acetone in an ultrasonicator for 10 minutes and kept in a desiccator to dry, so as to serve as the bottom semiconductor. Then, Synthesis Example 1 to Synthesis Example 3 are diluted with ethanol to 24 μg/mL as the top semiconductor, and dropped on the dried silicon wafer and germanium wafer, then placed in the desiccator to complete the semiconductor heterojunction of Example 1 to Example 9. Example 1 to Example 9 are measured and analyzed for the photo-responsive conductivity.

The combinations of the different facets of the top semiconductor and the bottom semiconductor of Example 1 to Example 9 are shown in Table 1.

TABLE 1

|  | top semiconductor | bottom semiconductor |
| --- | --- | --- |
| Example 1 | Synthesis Example 1 | Si {100} facet |
| Example 2 | Synthesis Example 2 | Si {111} facet |
| Example 3 | Synthesis Example 2 | Si {100} facet |
| Example 4 | Synthesis Example 2 | Si {110} facet |
| Example 5 | Synthesis Example 1 | Si {110} facet |
| Example 6 | Synthesis Example 3 | Si {111} facet |
| Example 7 | Synthesis Example 3 | Ge {100} facet |
| Example 8 | Synthesis Example 2 | Ge {100} facet |
| Example 9 | Synthesis Example 3 | Ge {111} facet |

Photo-Responsive Conductivity Analysis

The device for measuring the photo-responsive conductivity of the present disclosure includes a light source, a conductive probe, and an atomic force microscope (AFM). The light source is a white light LED with a power density 30 W/cm$^2$, and the distance between the light source and the embodiment is 10 cm. The conductive probe has Pt/Ir coating with a spring constant of 2 N/m and a resonance frequency at 70 kHz. The atomic force microscope model is Bruker, and the conductivity measurement is accomplished by using the PF-TUNA.

Example 1 to Example 9 are the performed measurements and the analysis of the photo-responsive conductivity, so as to obtain a graph of voltage-vs.-current, and plot an adjusted band diagram to explain the observed the facet-dependent electrical conductivity characteristic of the semiconductor. In the graph of voltage-vs.-current, Cu$_2$O {100} to Si {100} represents that the current flows from Cu$_2$O {100} facet to Si {100} facet, the rest of the combinations are deduced by analogy, and are not further described. However, in the adjusted band diagram, q$\Phi_m$ is metal work function, q$\Phi_s$ is semiconductor work function, E$_g$ is semiconductor band gap, E$_{VBM}$ is maximum electron valence band. The degree of interfacial band bending is plotted to reflect the observed electrical conductivity difference for the different facet combinations between the top semiconductor and the bottom semiconductor.

Figure 2B:
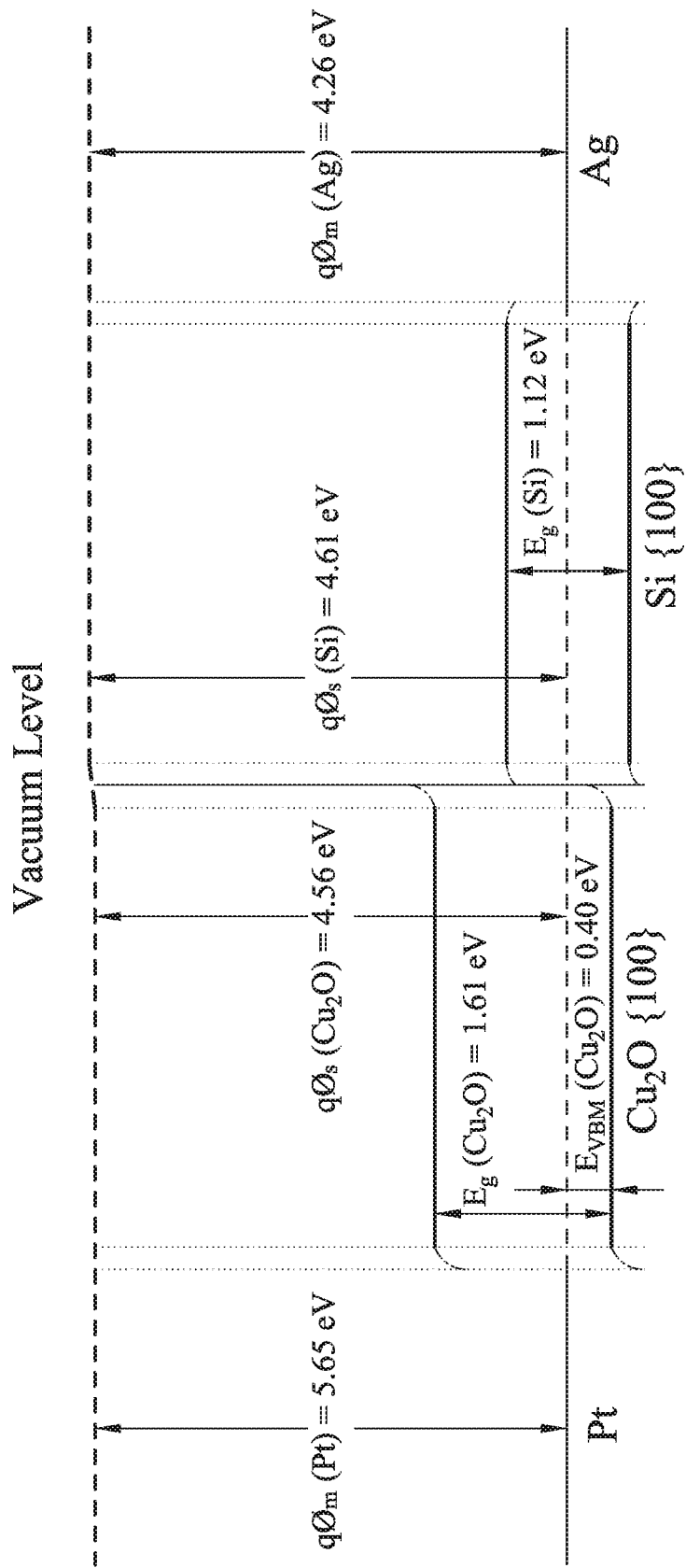
FIG. 2B is an adjusted band diagram according to Example 1 of the present disclosure.

Please refer to FIG. 2A and FIG. 2B, wherein FIG. 2A is a graph of voltage-vs.-current with and without light illumination according to Example 1 of the present disclosure. FIG. 2B is an adjusted band diagram according to Example 1 of the present disclosure. As shown in FIGS. 2A and 2B, with and without light illumination, the current flows only when the voltage is at −1.5 V or less, and the current value is very small, about 1 nA or less. Moreover, the energy barriers of the current flows from Cu$_2$O {100} facet to Si {100} facet and Si {100} facet to Cu$_2$O {100} facet are similar. Therefore, Si {100} facet and Cu$_2$O {100} (Cu$_2$O cube) have lower conductivity, and the conductivities of both are similar.

Figure 3A:
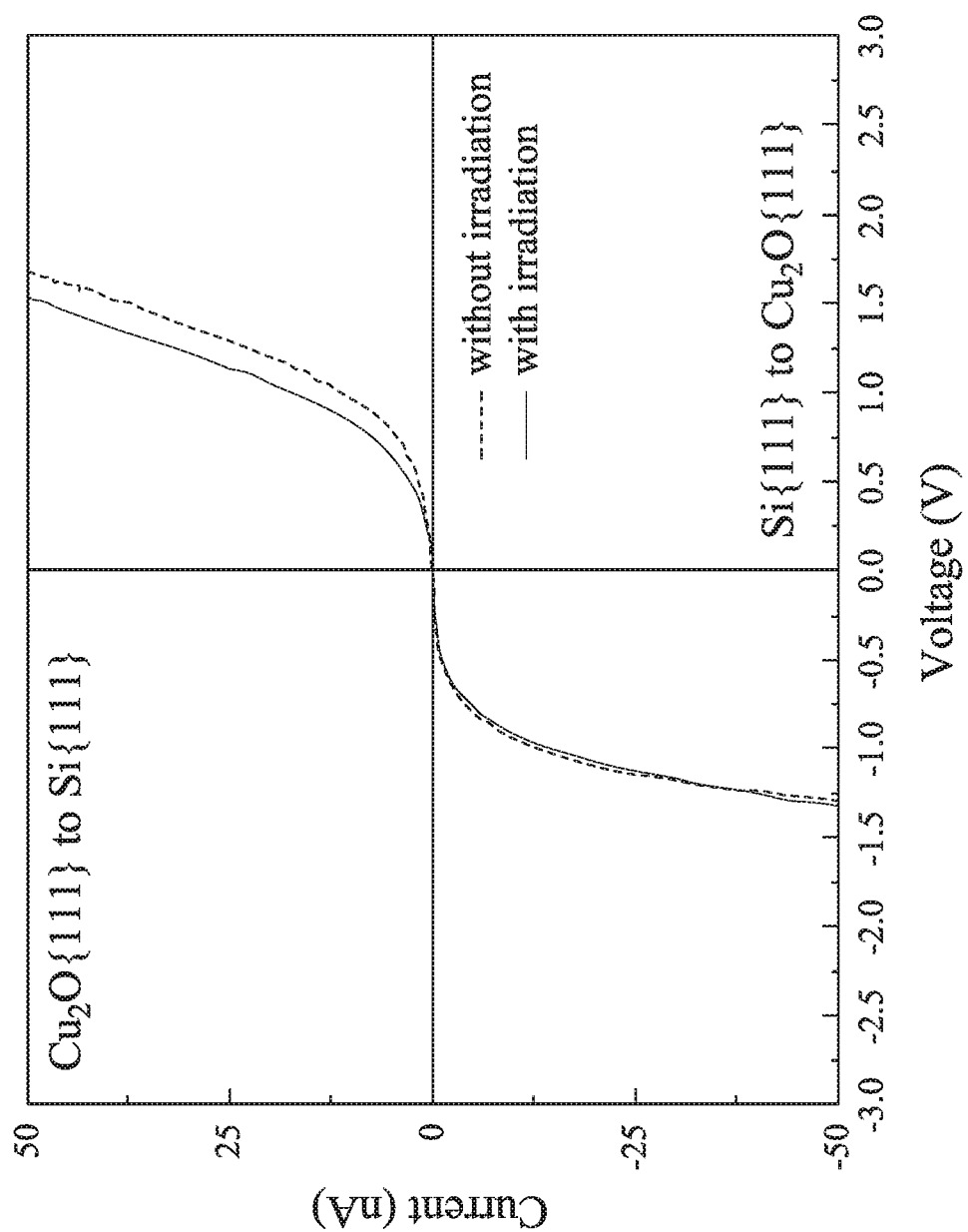
FIG. 3A is a graph of voltage-vs.-current with and without light illumination according to Example 2 of the present disclosure.
Figure 3B:
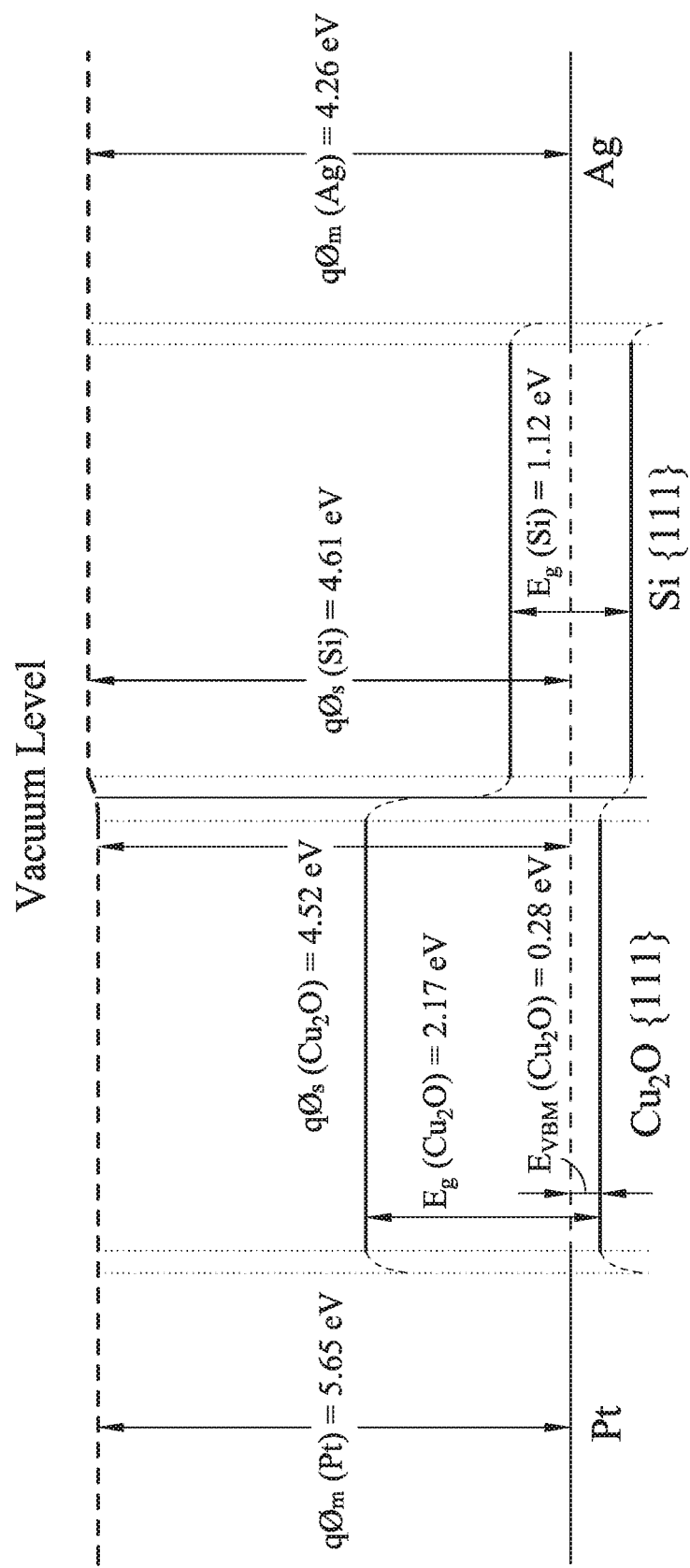
FIG. 3B is an adjusted band diagram according to Example 2 of the present disclosure.

Please refer to FIG. 3A and FIG. 3B, wherein FIG. 3A is a graph of voltage-vs.-current with and without light illumination according to Example 2 of the present disclosure. FIG. 3B is an adjusted band diagram according to Example 2 of the present disclosure. As shown in FIGS. 3A and 3B, with and without light illumination, when the voltage is at 1.5 V to 1.75 V, the current can reach to 50 nA, indicating that at the same voltage, the conductivities of Si {111} facet and Cu$_2$O {111} facet are higher than that of Si {100} facet and Cu$_2$O {100} facet, respectively. Moreover, the energy barriers of the current flows from Cu$_2$O {111} facet to Si {111} facet and Si {111} facet to Cu$_2$O {111} facet are similar. Therefore, Si {111} facet and Cu$_2$O {111} (Cu$_2$O octahedron) have higher conductivity, and the conductivities of both are similar.

Figure 4A:
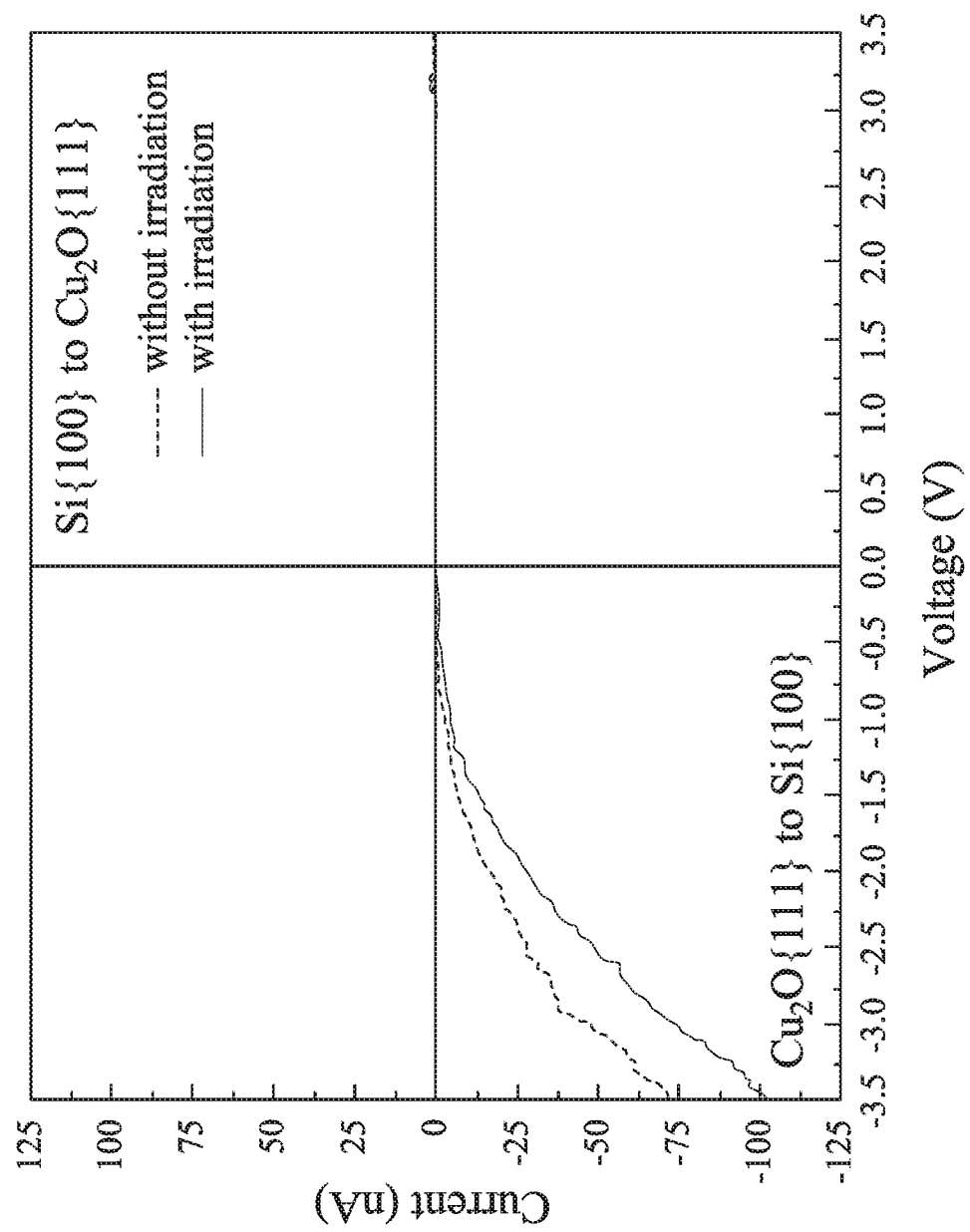
FIG. 4A is a graph of voltage-vs.-current with and without light illumination according to Example 3 of the present disclosure.
Figure 4B:
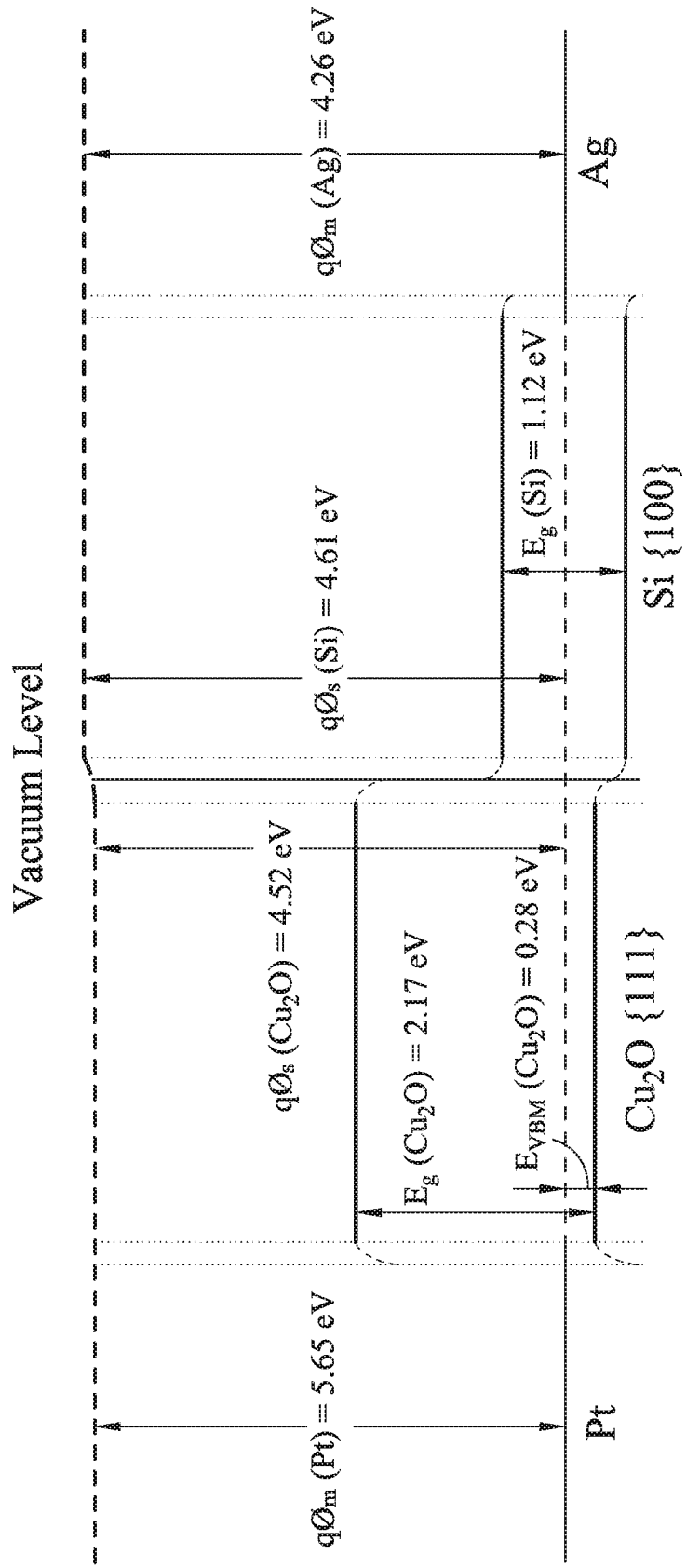
FIG. 4B is an adjusted band diagram according to Example 3 of the present disclosure.

Please refer to FIG. 4A and FIG. 4B, wherein FIG. 4A is a graph of voltage-vs.-current with and without light illumination according to Example 3 of the present disclosure. FIG. 4B is an adjusted band diagram according to Example 3 of the present disclosure. As shown in FIGS. 4A and 4B, the curve of voltage and current is asymmetric. Specifically, when the voltage is −3.5 V, the currents without light illumination and with light illumination are 75 nA and 100 nA, respectively. Furthermore, when the current flows in the opposite direction, the current is 0 nA and maintained to 3.5 V, so that the rectifying effect is generated. The result is similar to the p-n junction, and is suitable as the field effect transistor.

Figure 5A:
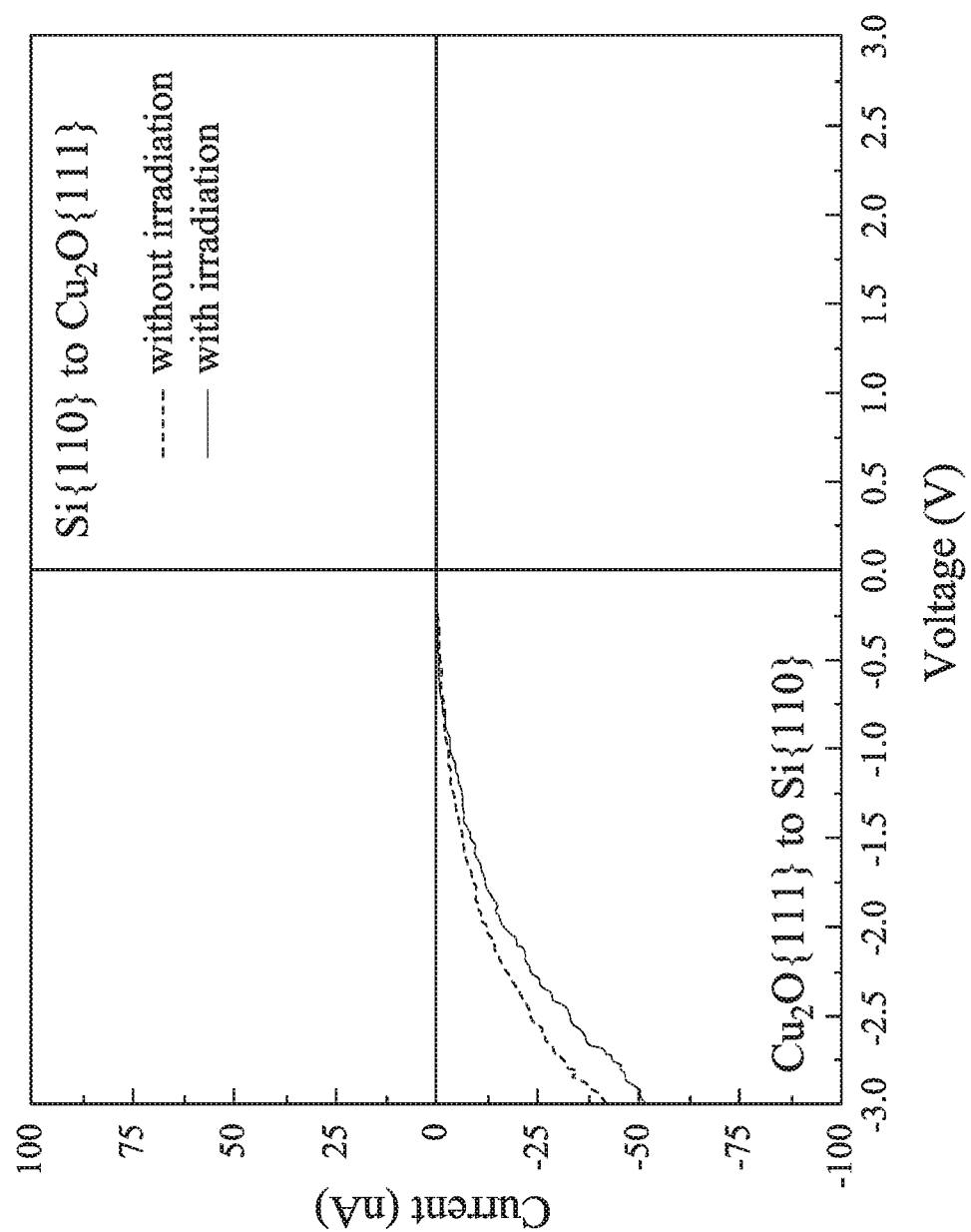
FIG. 5A is a graph of voltage-vs.-current with and without light illumination according to Example 4 of the present disclosure.
Figure 5B:
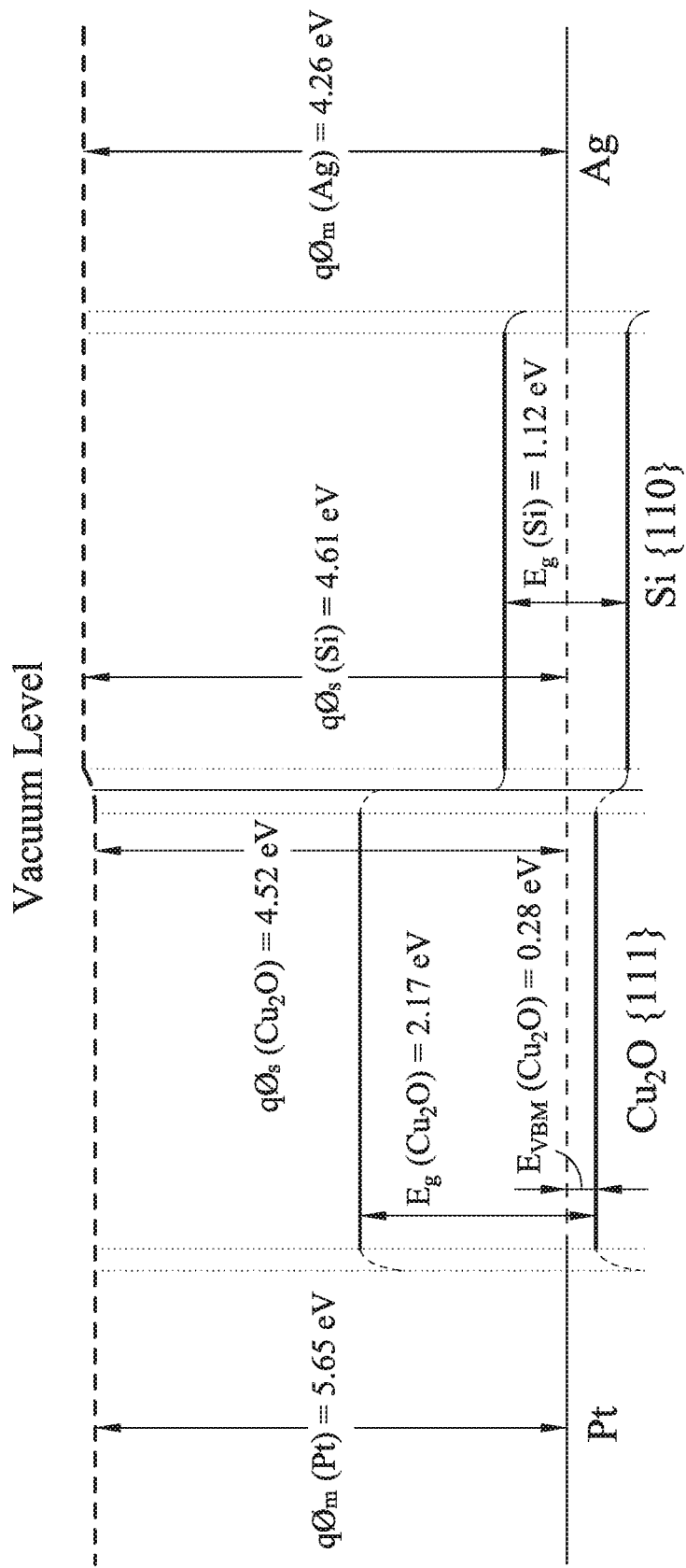
FIG. 5B is an adjusted band diagram according to Example 4 of the present disclosure.

Please refer to FIG. 5A and FIG. 5B, wherein FIG. 5A is a graph of voltage-vs.-current with and without light illumination according to Example 4 of the present disclosure. FIG. 5B is an adjusted band diagram according to Example 4 of the present disclosure. As shown in FIGS. 5A and 5B, the curve of voltage and current is asymmetric. Specifically, when the voltage is −3.0 V, the currents without light illumination and with light illumination are 38 nA and 50 nA, respectively. Furthermore, when the current flows in the opposite direction, the current is 0 nA and maintained to 3.0 V, so that the rectifying effect is generated. The result is similar to the p-n junction, and is suitable as the field effect transistor. Moreover, comparing Example 3 and Example 4, it can be seen that at the same voltage, the current flows to Si {100} facet is greater than that of Si {110} facet, so that the conductivity of Si {100} facet is higher than that of Si {110} facet.

Figure 6A:
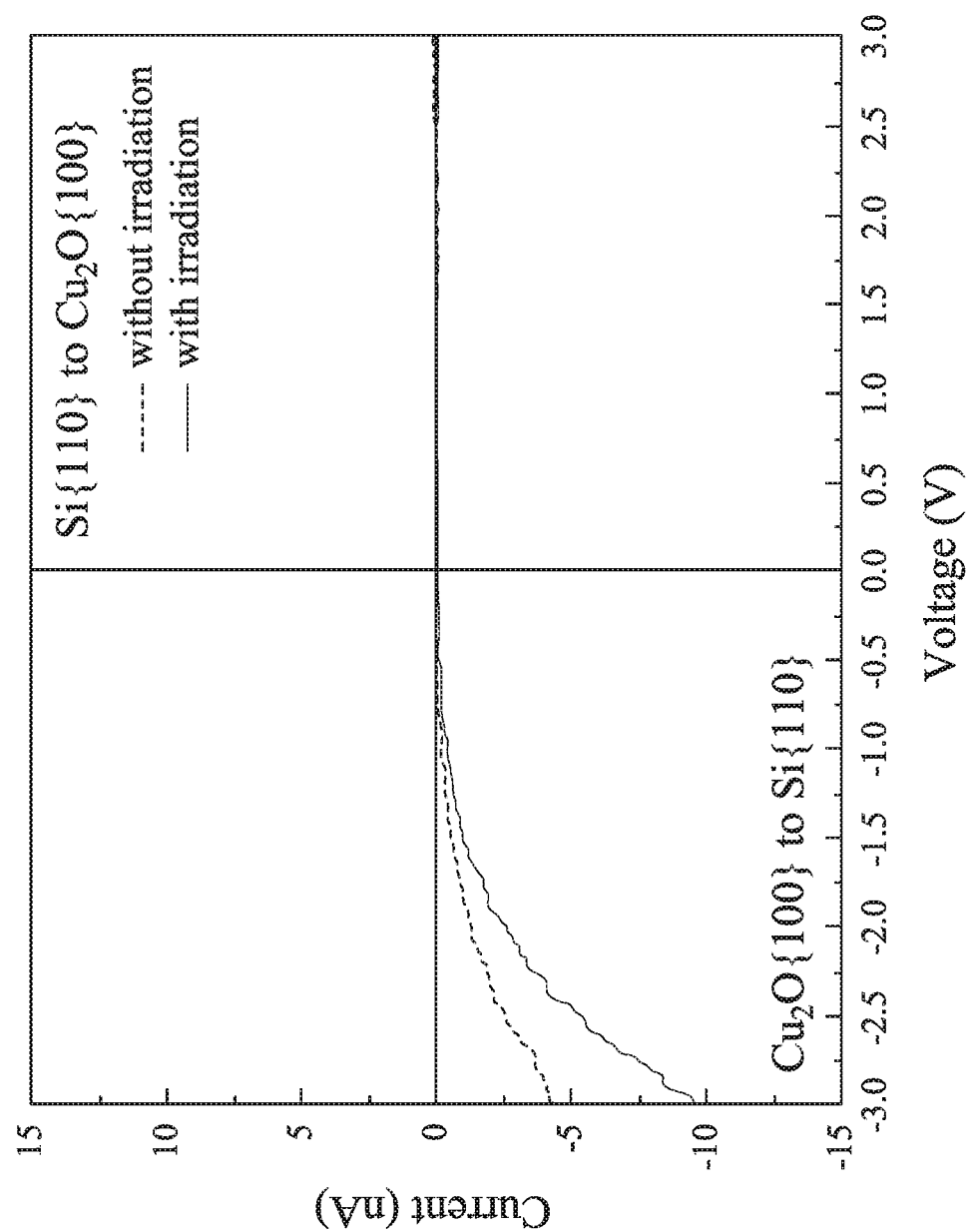
FIG. 6A is a graph of voltage-vs.-current with and without light illumination according to Example 5 of the present disclosure.
Figure 6B:
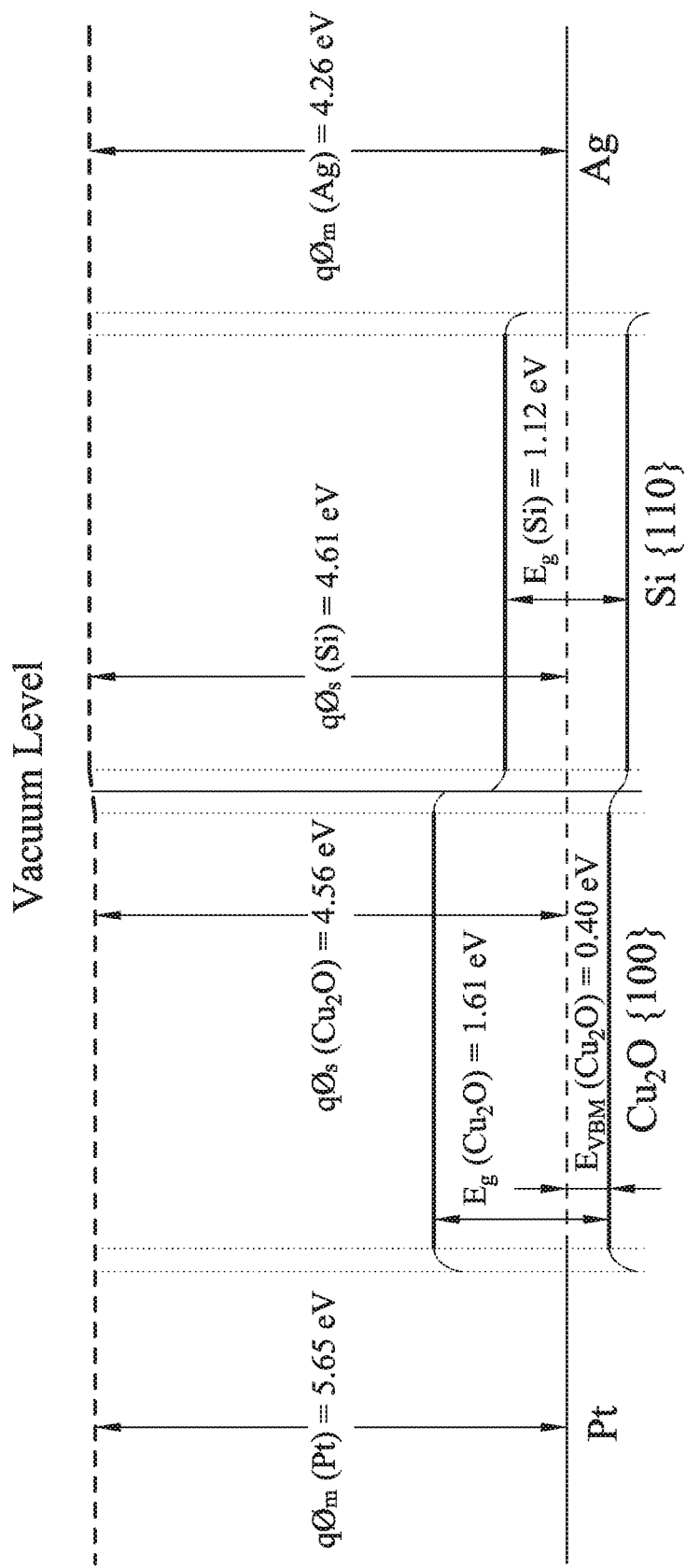
FIG. 6B is an adjusted band diagram with light illumination according to Example 5 of the present disclosure.
Figure 6C:
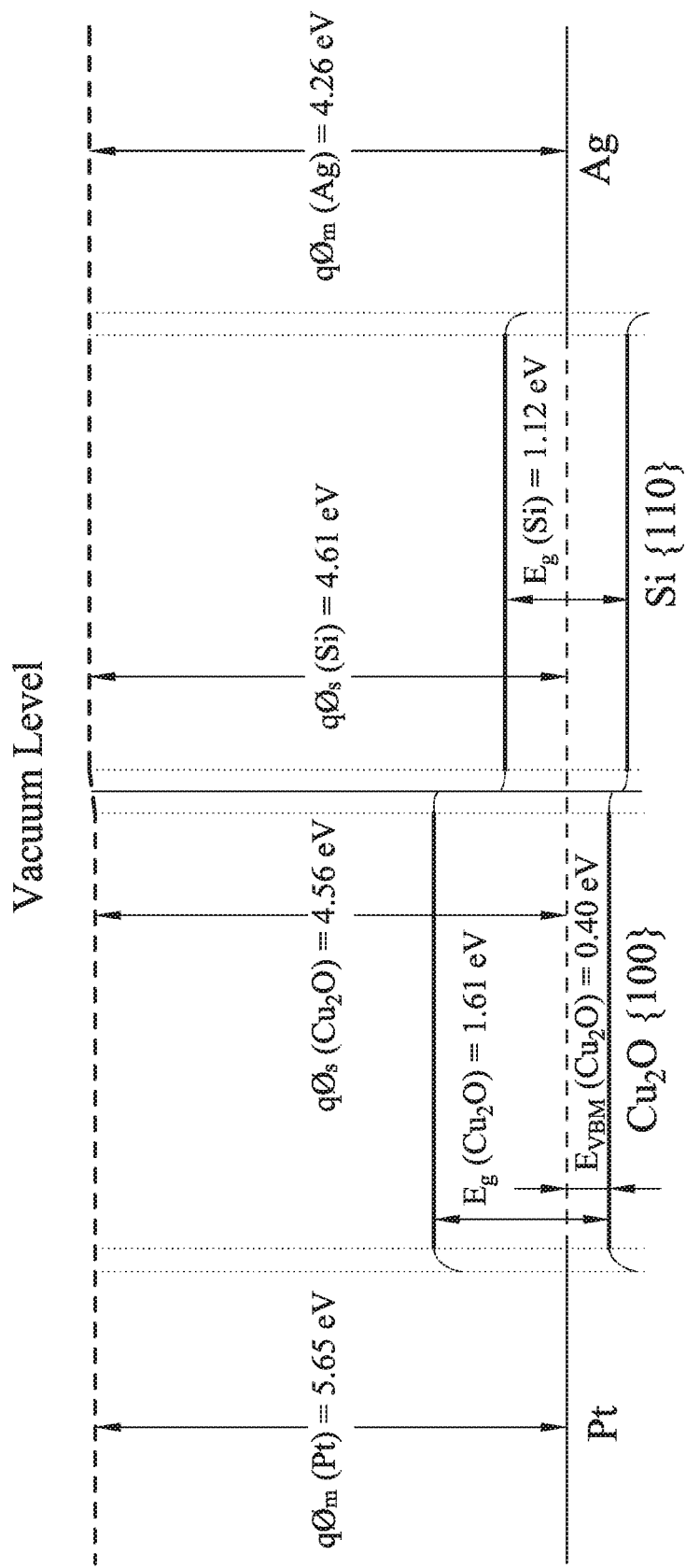
FIG. 6C is an adjusted band diagram without light illumination according to Example 5 of the present disclosure.

Please refer to FIG. 6A, FIG. 6B, and FIG. 6C, wherein FIG. 6A is a graph of voltage-vs.-current with and without light illumination according to Example 5 of the present disclosure. FIG. 6B is an adjusted band diagram with light illumination according to Example 5 of the present disclosure. FIG. 6C is an adjusted band diagram without light illumination according to Example 5 of the present disclosure. As shown in FIGS. 6A, 6B and 6C, when the voltage is −3.0 V, the currents without light illumination and with light illumination are 4 nA and 9 nA, respectively. The result indicates that the current with light illumination is 2 times different from the current without light illumination. Furthermore, in combination with the energy barriers of the current flows from Cu$_2$O {100} facet to Si {110} facet and Si {110} facet to Cu$_2$O {100} facet in the adjusted band diagram with light illumination and without light illumination, photocurrent response occurs between Cu$_2$O {100} facet and Si {110} facet, which is suitable as a photodetector.

Figure 7A:
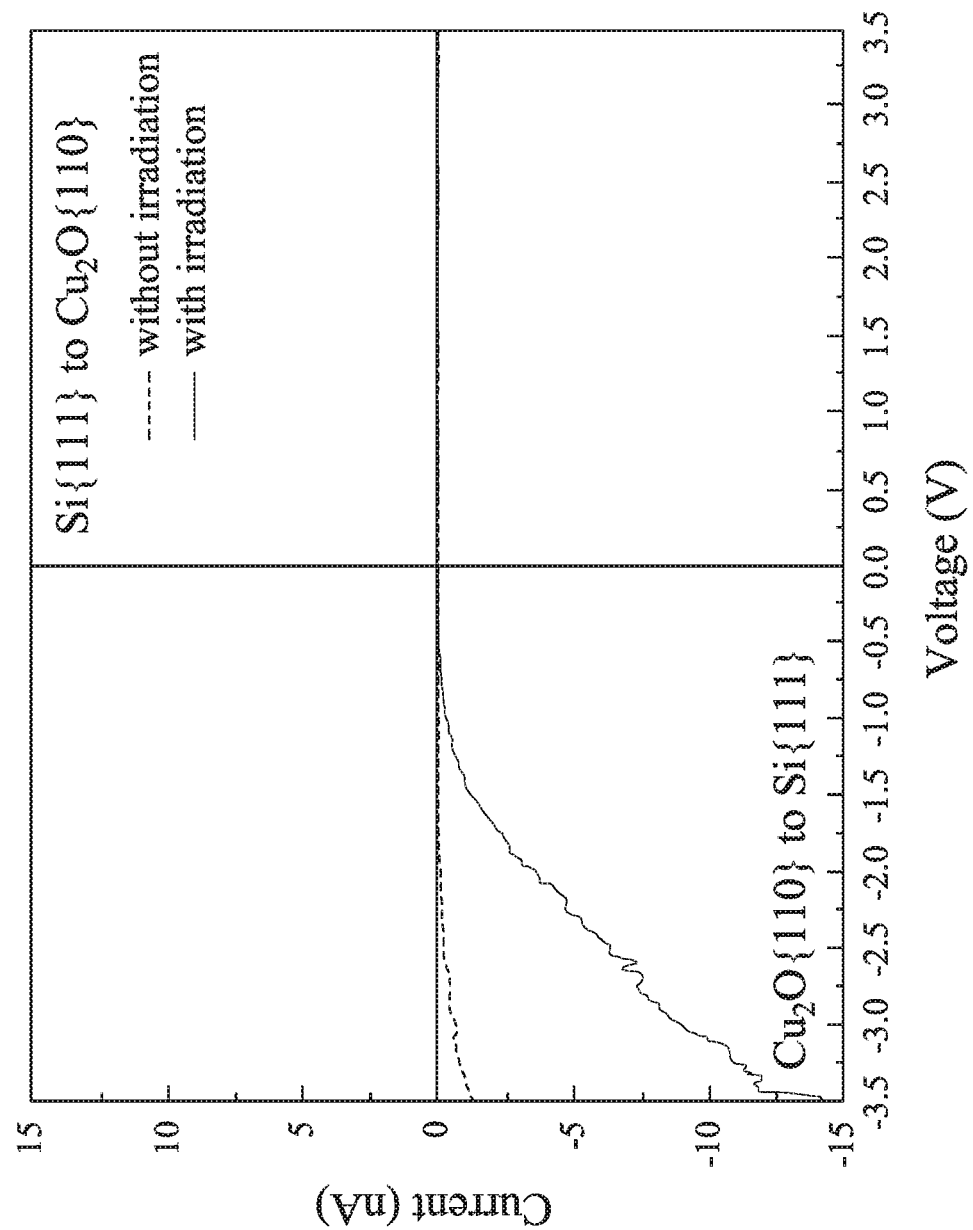
FIG. 7A is a graph of voltage-vs.-current with and without light illumination according to Example 6 of the present disclosure.
Figure 7B:
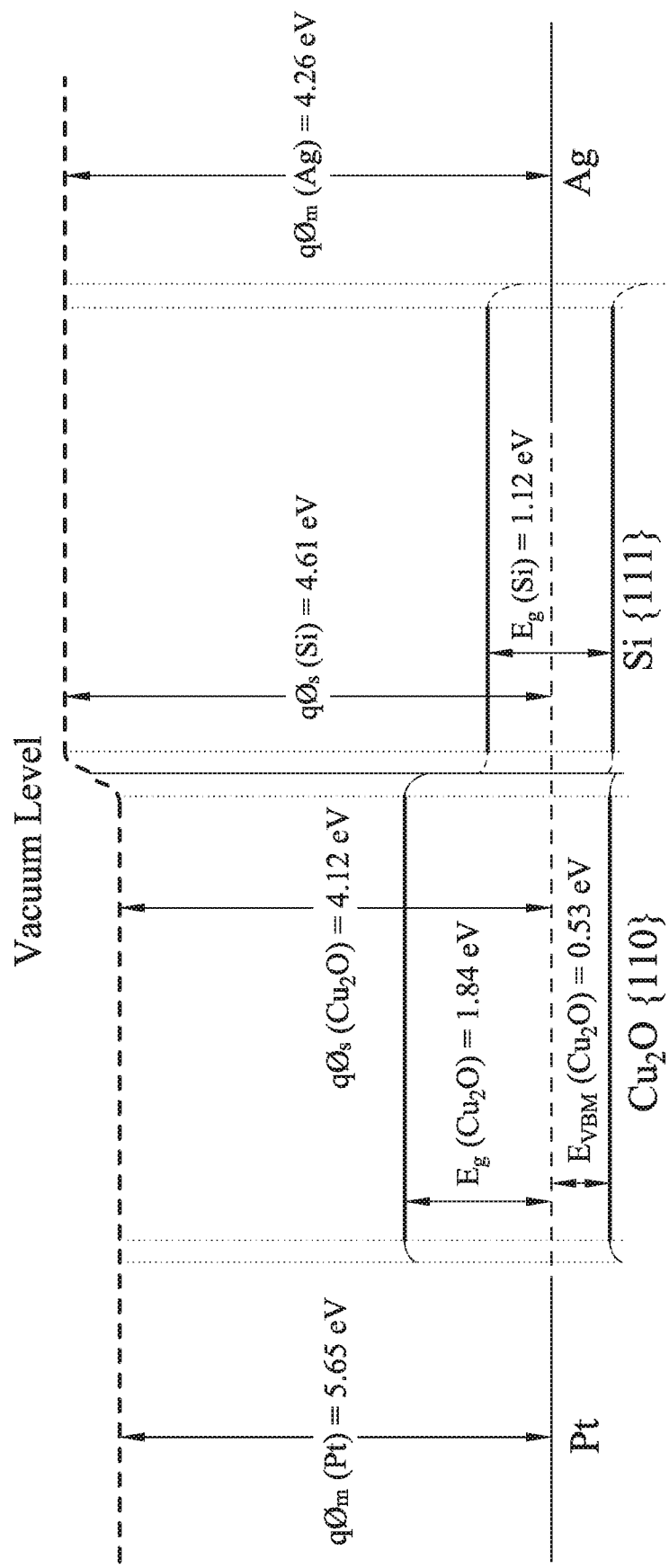
FIG. 7B is an adjusted band diagram with light illumination according to Example 6 of the present disclosure.
Figure 7C:
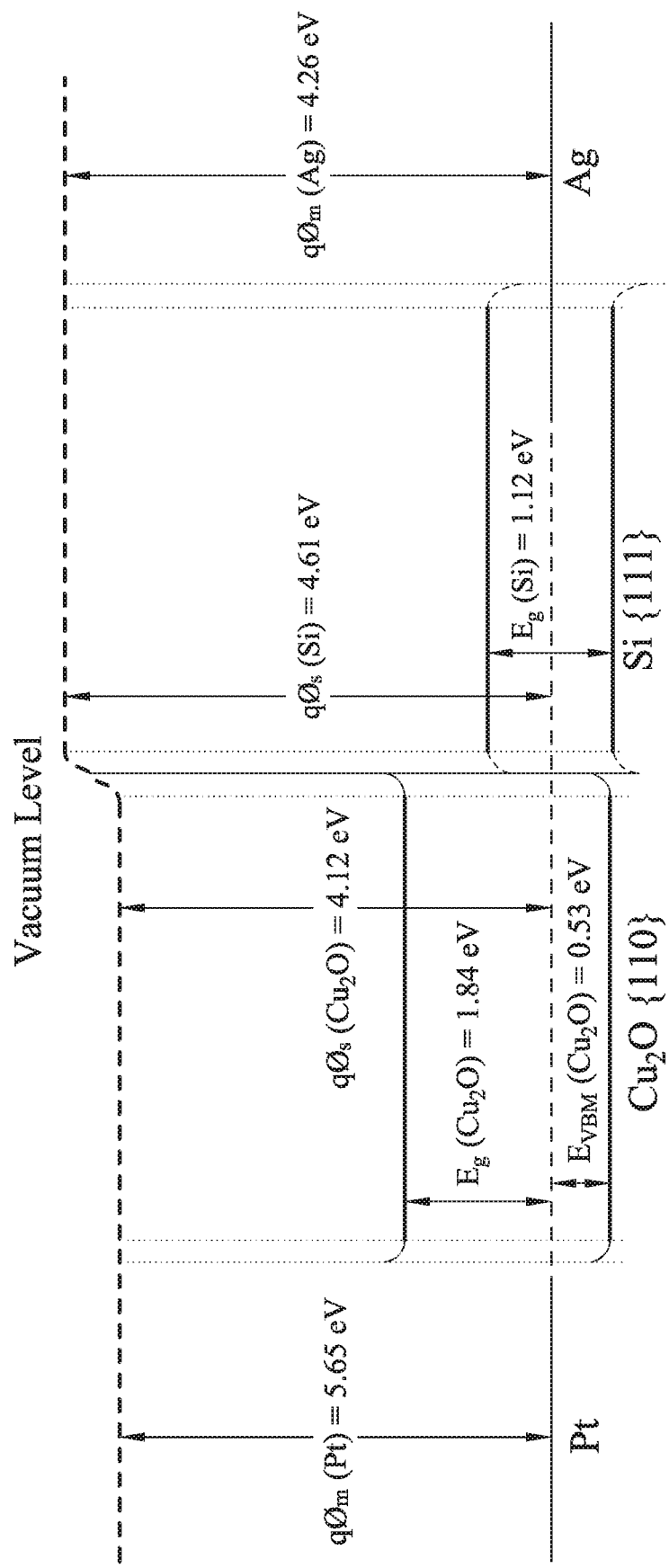
FIG. 7C is an adjusted band diagram without light illumination according to Example 6 of the present disclosure.

Please refer to FIG. 7A, FIG. 7B, and FIG. 7C, wherein FIG. 7A is a graph of voltage-vs.-current with and without light illumination according to Example 6 of the present disclosure. FIG. 7B is an adjusted band diagram with light illumination according to Example 6 of the present disclosure. FIG. 7C is an adjusted band diagram without light illumination according to Example 6 of the present disclosure. As shown in FIGS. 7A, 7B and 7C, when the voltage is −3.5 V, the currents without light illumination and with light illumination are 1 nA and 14 nA, respectively. The result indicates that the current with light illumination is 14 times different from the current without light illumination. Furthermore, in combination with the energy barriers of the current flows from Cu$_2$O {110} facet to Si {111} facet and Si {111} facet to Cu$_2$O {110} facet in the adjusted band diagram with light illumination and without light illumination, photocurrent response occurs between Cu$_2$O {110} facet and Si {111} facet, which is suitable as the photodetector. Moreover, comparing Example 5 and Example 6, it can be seen that at the same voltage, the photocurrent response of Example 6 is higher than that of Example 5.

Figure 8:
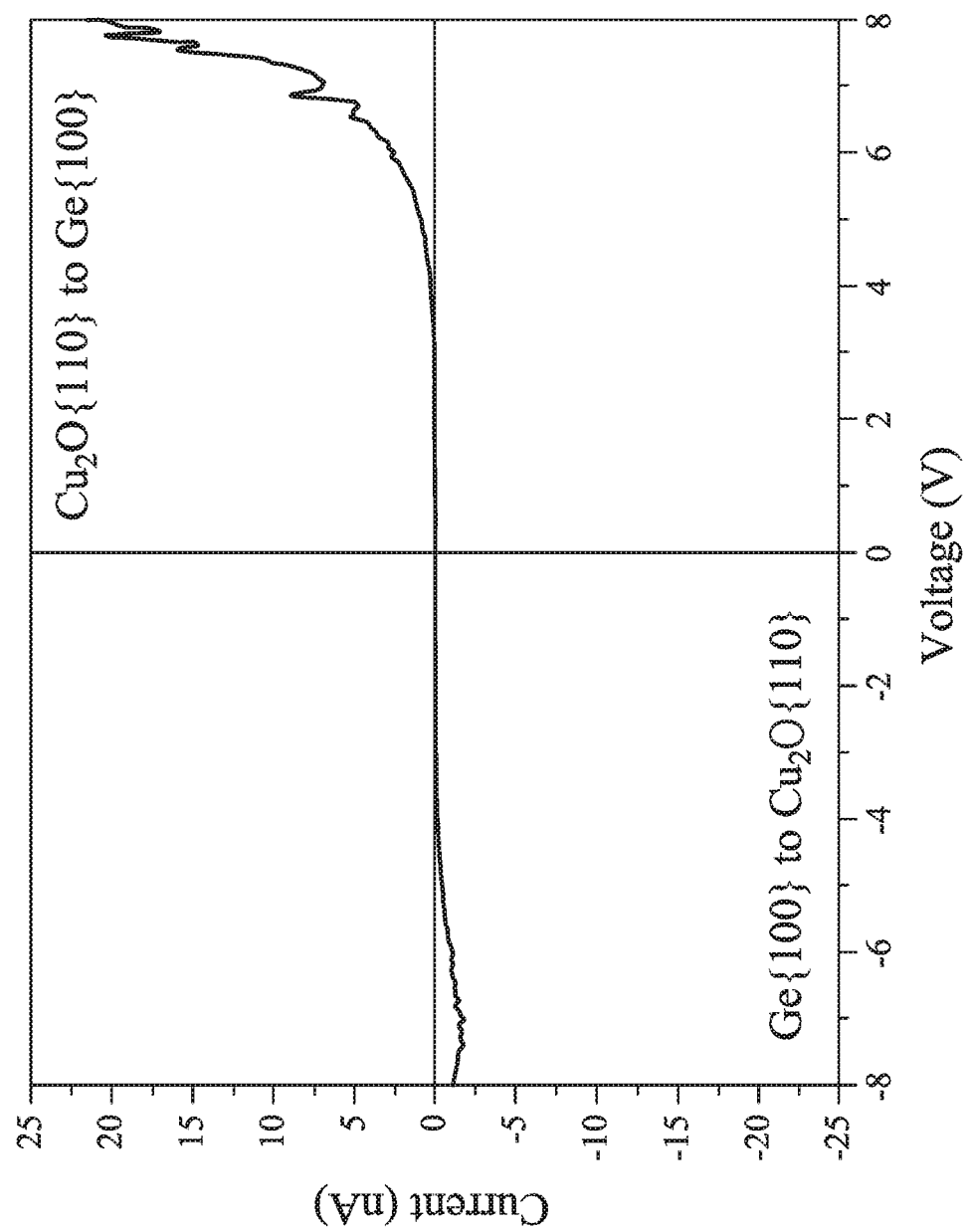
FIG. 8 is a graph of voltage-vs.-current according to Example 7 of the present disclosure.
Figure 9:
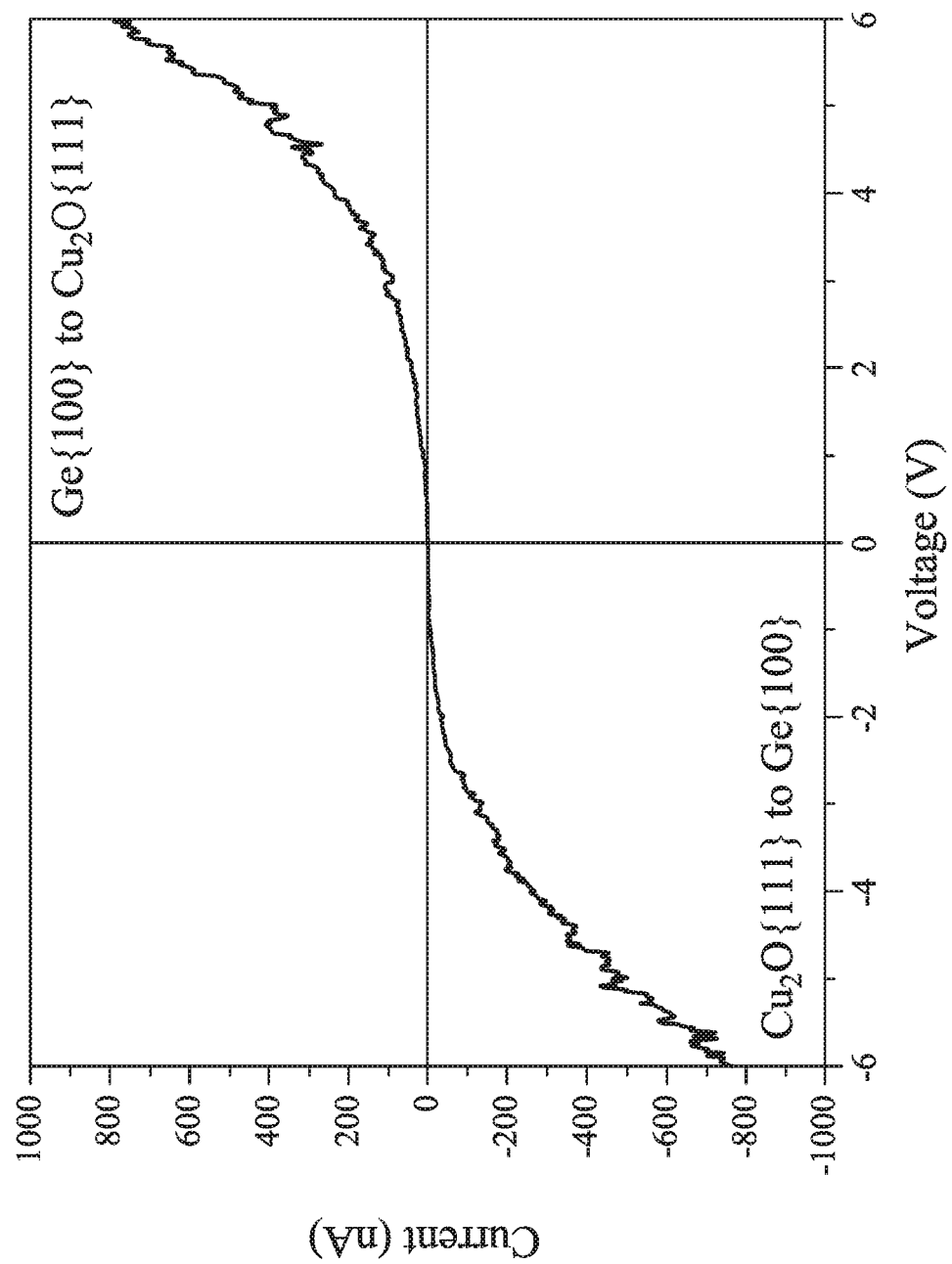
FIG. 9 is a graph of voltage-vs.-current according to Example 8 of the present disclosure.
Figure 10:
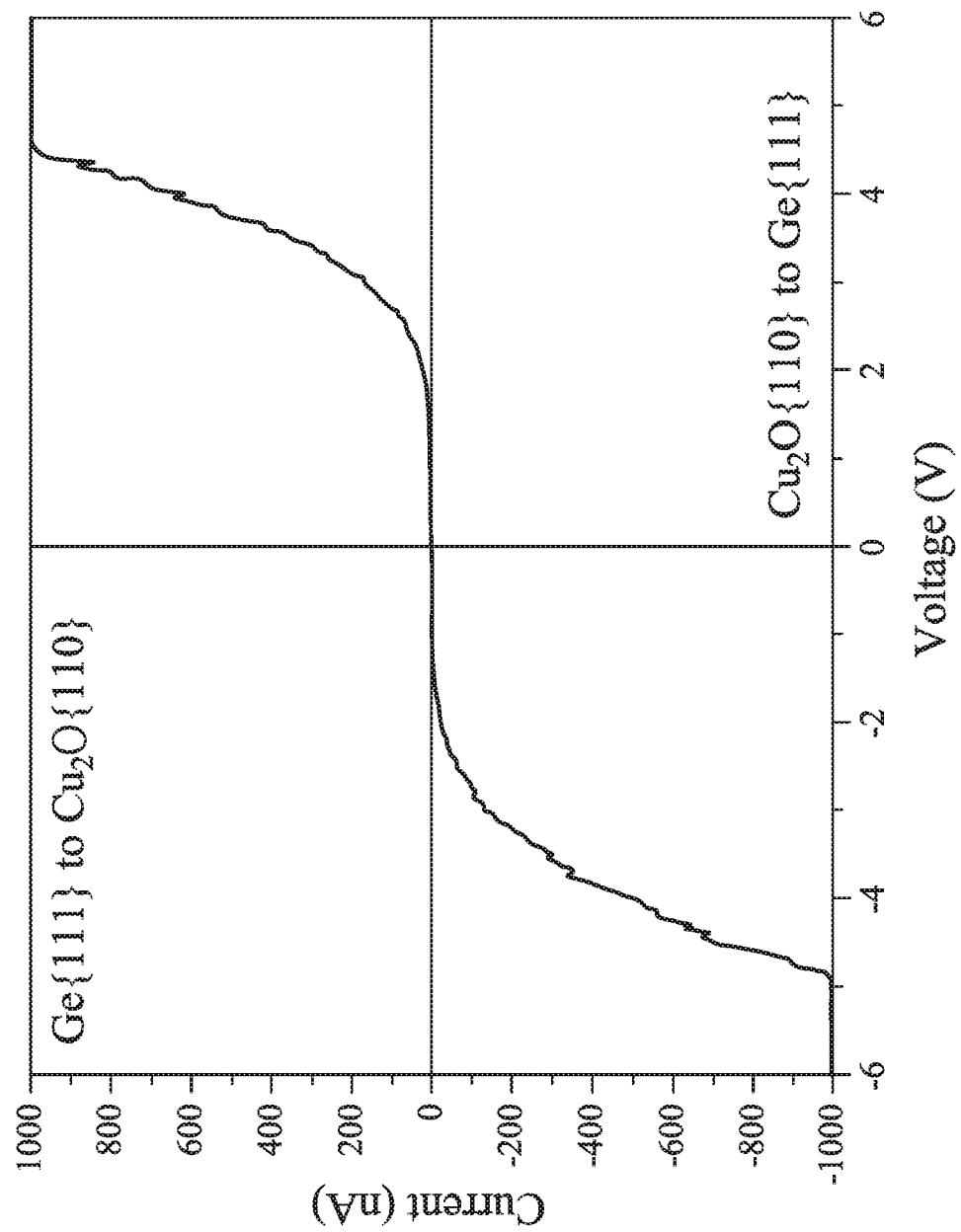
FIG. 10 is a graph of voltage-vs.-current according to Example 9 of the present disclosure.

Please refer to FIG. 8, FIG. 9 and FIG. 10, wherein FIG. 8 is a graph of voltage-vs.-current according to Example 7 of the present disclosure. FIG. 9 is a graph of voltage-vs.-current according to Example 8 of the present disclosure. FIG. 10 is a graph of voltage-vs.-current according to Example 9 of the present disclosure. As shown in FIGS. 8, 9 and 10, Ge {100} facet and Cu$_2$O {110} facet (Cu$_2$O rhombic dodecahedron) of Example 7 has the asymmetric voltage-vs.-current curve, which can be used as the field effect transistor. Furthermore, both Example 8 and Example 9 are symmetric voltage-vs.-current curve, and at the voltage of 6 V, the current of Example 9 is as high as 1000 nA, which is higher than 800 nA of Example 8, indicating that the conductivity of Example 9 is higher than Example 8.

Therefore, in the present disclosure, the field effect transistor or the photodetector including the foregoing semiconductor heterojunction can be further provided. According to the actual measurement results of the present disclosure, Example 3 and Example 4 are suitable for the field effect transistor due to the asymmetric voltage-vs.-current curve similar to the p-n junction, and can produce a rectifying effect. Furthermore, Example 5 and Example 6 are suitable for the photodetector, because at the same voltage, the current difference between light illumination and without light illumination is large.

The design of the field effect transistor and the photodetector are suitable for all semiconductor combinations, and the facet combinations of two different semiconductors are controlled to achieve the desired effect. That is, the semiconductor materials can be different, and the desired electrical response or photocurrent response is mainly generated by forming the semiconductor heterojunction with the favorable combination of facet.

In conclusion, the semiconductor heterojunction of the present disclosure observes the facet effect in the semiconductor material by measuring the photo-responsive conductivity of the combination of different facets between two different semiconductors. Without actual measurement, the electrical conductivity, the photocatalytic and the optical properties of different semiconductors cannot be accurately predicted, and based on the trend of different electrical response or photocurrent response to apply to related electronic or optical device as required.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor heterojunction, comprising:
   a bottom semiconductor, wherein an upper surface of the bottom semiconductor comprises a first facet, and the bottom semiconductor is a silicon wafer, a germanium wafer, or a gallium arsenide wafer;
   a top semiconductor, wherein a lower surface of the top semiconductor comprises a second facet, and the lower surface of the top semiconductor is contacted with the upper surface of the bottom semiconductor; and
   an electrode substrate disposed below the bottom semiconductor;
   wherein the first facet and the second facet are selected from the group consisting of a {100} facet, a {110} facet and a {111} facet.

2. The semiconductor heterojunction of claim 1, wherein the top semiconductor is synthesized in a solution phase method, and deposited on the bottom semiconductor.

3. The semiconductor heterojunction of claim 1, wherein the top semiconductor is an oxide, a sulfide or a selenide.

4. The semiconductor heterojunction of claim 3, wherein the top semiconductor is a cuprous oxide nanocrystal.

5. The semiconductor heterojunction of claim 1, wherein the electrode substrate is a stainless steel electrode.

6. The semiconductor heterojunction of claim 1, further comprising:
   a silver glue layer disposed between a lower surface of the bottom semiconductor and the electrode substrate.

7. A field effect transistor, comprising:
   the semiconductor heterojunction of claim 1.

8. A photodetector, comprising:
   the semiconductor heterojunction of claim 1.

* * * * *